United States Patent [19]

Berg et al.

[11] Patent Number: 4,958,259
[45] Date of Patent: Sep. 18, 1990

[54] MULTI-PURPOSE HOUSING

[75] Inventors: Franco Berg, Garbsen; Claus-Dieter Bovermann, Breidenbach-Niederdieten, both of Fed. Rep. of Germany

[73] Assignee: Rittal-Werk Rudolf Loh GmbH & Co., KG, Fed. Rep. of Germany

[21] Appl. No.: 451,334

[22] Filed: Dec. 14, 1989

Related U.S. Application Data

[63] Continuation-in-part of Ser. No. 102,096, Sep. 29, 1987.

[30] Foreign Application Priority Data

Sep. 30, 1986 [DE] Fed. Rep. of Germany ....... 3633284

[51] Int. Cl.$^5$ ............................................. H05K 5/00
[52] U.S. Cl. ...................................... 361/394; 220/84; 312/265.5; 312/265.2; 361/395; 361/429
[58] Field of Search ................... 174/50, 50.51, 52 R; 220/4 F, 4 B, 4 C, 7, 84; 312/257 R, 257 SK, 257 SM, 257 A; 361/331, 390, 391, 394, 395, 399, 424, 428, 429

[56] References Cited

U.S. PATENT DOCUMENTS

| | | | |
|---|---|---|---|
| 3,307,894 | 3/1967 | Collier | 312/257 R |
| 3,316,460 | 4/1967 | Scoville | . |
| 4,172,623 | 10/1979 | Anderson | 174/52 R |
| 4,426,935 | 1/1984 | Nikoden | 312/257 SM |
| 4,558,797 | 12/1985 | Mitchell | 220/4 F |
| 4,689,722 | 8/1987 | Debus et al. | 361/391 |

FOREIGN PATENT DOCUMENTS

| | | |
|---|---|---|
| 2516872 | 2/1977 | Fed. Rep. of Germany . |
| 3334587 | 4/1985 | Fed. Rep. of Germany . |
| 3633284 | 6/1989 | Fed. Rep. of Germany . |
| 2374819 | 7/1978 | France . |
| 2460091 | 1/1981 | France . |
| 2035703 | 6/1980 | United Kingdom . |

Primary Examiner—Gregory D. Thompson
Attorney, Agent, or Firm—Thomas W. Speckman; Douglas H. Pauley

[57] ABSTRACT

A multi-purpose housing for electrotechnical equipment including two identical side walls, a top wall and a bottom wall. Component holders and slide rails for flange supports and back wall, door or inspection windows can be attached to the multi-purpose housing. The housing structure, installation of various electrotechnical devices, and attachment of a back wall, door or inspection window is significantly simplified by providing vertically continuous T-grooves on the inner surfaces of the side walls. The T-grooves are spaced at equal intervals. At least a portion of the T-grooves have an open groove base which makes a transition to a continuous screw channel having an approximately round cross section. Offset T-grooves are provided in corner units. Covering strips or connecting strips with tapped holes can be inserted into the T-grooves.

20 Claims, 8 Drawing Sheets

MULTI-PURPOSE HOUSING

CROSS-REFERENCE TO RELATED APPLICATION

This application is a continuation-in-part of my co-pending application Ser. No. 07/102,096, filed Sept. 29, 1987, now abandoned.

BACKGROUND OF THE INVENTION

1. Field of the Invention

The present invention relates to a multi-purpose housing for electrotechnical equipment. The multi-purpose housing comprises two identical side walls, a top wall and a bottom wall. The multi-purpose housing accommodates the installation of component holders, the installation of guide plates and cross supports and the installation of slide rails which are used for flange supports and for attaching a back wall, a door or an inspection window.

2. Description of the Prior Art

A multi-purpose housing is taught by West German Patent Publication DE-OS No. 33 34 587. Instead of providing a frame or framework, components of the multi-purpose housing are connected directly with one another due to their complementary design. Thus many of the same parts may be used. This prior art multi-purpose housing facilitates quick assembly. Installation of component holders, guide plates for cross supports and slide rails for insertable units, in each case requires that special devices are mounted in the multi-purpose housing.

As taught by West German Patent Publication DE-AS No. 5 23 292, contoured structural segments have been used as top and bottom parts for these types of multipurpose housings. The interiors of these contoured structural segments have T-grooves, at regular intervals, in which nuts may be inserted and aligned so that they are horizontally slidable. As taught by the '292 patent, additional mounting parts are connectible to the top and bottom walls of the multi-purpose housing. This structure of a multi-purpose housing is suitable for mounting a single component holder or a single row of support strips for conductor plates at a single height. As the height of the multi-purpose housing greatly increases, fastening problems arise, since the smooth side walls do not provide the required fastening options.

SUMMARY OF THE INVENTION

It is an objective of the present invention to provide a multi-purpose housing of the type where it is possible to retain simple and interchangeable parts for mounting component holders, cross-supports and slide rails for flange supports.

It is another objective to attach a back wall and a door or an inspection window at random heights in the receiving space of the multi-purpose housing. The height of the housing can be simply adjusted to meet dimensional requirements of the devices which can be mounted.

According to the present invention, the side walls have vertically continuous T-grooves on their inner surfaces and are arranged at regular intervals. For at least part of the vertical height of the T-grooves, the groove base opens into a continuous screw channel which is generally round in cross section. The first and last T-grooves in the side walls are provided in corner units and are offset from the other T-grooves toward the outside by a prescribed amount. Connecting strips with tapped holes or covering strips are insertable into the T-grooves.

Providing offset T-grooves in the side walls has the advantage, with respect to the prior art multi-purpose housings, that several mounting zones may be created in different planes since there is freedom in all mounting zones to insert a component holder, guide plates for cross-supports, or slide rails for insertable units. By offsetting the T-grooves in the corner units, mounts for attaching either a back wall, a door or an inspection window are formed on the open sides of the frame which comprise the side walls and the top and bottom walls. Fastening options for these components are provided. The multi-purpose housing is a universal housing and when equipped with a back wall and door or inspection window, it becomes a visually and aesthetically pleasing unit. The side walls may be designed as segments of structural units and thus may be simply adapted to different structural heights of the housing.

The screw channels may directly accept the fastening screws for the top and bottom walls at the horizontal edges of the side walls. Self-tapping fastening screws are preferred for use with metal side walls, such as aluminum.

According to one preferred embodiment, each side wall is designed to comprise a segment of a flat structural unit with T-grooves and two corner units. The corner units comprise sections of a corner structural unit and are fastened in the vicinity of the vertical edges on the outside of the flat wall section. The corner units project over the vertical edges of the wall sections and have T-grooves which are offset toward the outside in the projecting areas of the sides which run parallel to the inside of the wall section. The corner unit is thereby preferably designed as a rectangular hollow structural unit.

The wall section is connected to the two corner units according to one embodiment in that at least one connecting groove is on the outside of the wall sections in the vicinity of each vertical edge. The corner units have connecting webs on the side facing the side wall section which may be introduced into associated connecting grooves on the side wall section. A continuous connecting channel for a connecting pin is provided in the vicinity of the sides of the connecting groove and connecting web which face one another and which are perpendicular to the plane of the side wall section. The connecting channel is generally round in cross section and vertically continuous.

When the corner units cover the terminal vertical edge of the side wall section with a closing web, an enclosed transition region may be provided at the vertical sides of the mounting means for the back wall, the door or the inspection window.

The layout for components may be reduced still further in one embodiment wherein the side wall section and the two corner units are combined into a one-piece section of a side wall structural unit.

In a preferred embodiment, all T-grooves have the same cross-sectional configuration, in which transition segments are inclined toward the inside, forming the insertion slot of the T-grooves. The connecting strips and the covering strips may be provided with uniform cross-sectional configurations.

Assembly of the multi-purpose housing may be further simplified by providing identical top and bottom walls and in the vicinity of the vertical edges of the side wall sections they have a ledge which serves as a stop to define the position of the side wall sections.

According to another embodiment, the diameter of the tapped holes in the connecting strips is larger than the width of the opening in the groove base of the T-grooves. A connecting strip may thus be braced in the T-groove by means of a screw or similar fastener which is screwed into a tapped hole and supported at the groove base of the T-groove.

A plurality of mounting points or a complete covering of T-grooves over the entire height of the multi-purpose housing may be simply achieved if the length of the connecting strips and the covering strips corresponds to the height of the side wall sections and the corner units mounted on the side walls.

To mount a component holder which has lateral mounting flanges, mounting angles may be provided which in each case are screwed to one leg and via a connecting strip to the side walls. The mounting flanges of the component holder are detachably connected to the legs of the mounting angle which face one another.

Guide strips are supported on cross-supports which are connectible to the side walls by means of U-shaped mounting components and connecting strips.

In both cases, a screw fastened mounting may be provided by means of a single screw if the mounting angle and the mounting component are fixed to the side wall so they cannot pivot.

For attaching a back wall to the multi-purpose housing, one embodiment of the present invention has a boxshaped back wall that is fastenable to the side walls by means of casement fasteners which are pivotally mounted on the back wall. Fasteners project through a perforation in the vertical edge of the back wall and are pivotable into the offset T-grooves of the corner sections.

According to one embodiment, a door or an inspection window is hinged onto the multi-purpose housing by having a door or an inspection window that is securely attached in the vicinity of a vertical side wall edge with pivotable hinge components. The stationary hinge components are fixed with connecting strips and screws in the offset T-grooves of the corner units. A door or an inspection window may be mounted if connecting strips with tapped holes are molded onto the stationary hinge components.

Slide rails for insertable units may be installed by having L-shaped slide rails for insertable units which are fastenable to one leg by means of fastening strips in at least two T-grooves of a side wall and oriented horizontally with respect to the side walls.

BRIEF DESCRIPTION OF THE DRAWINGS

The invention will be described in greater detail with reference to embodiments illustrated in the drawings, in which.

DESCRIPTION OF PREFERRED EMBODIMENTS

Figure 1:
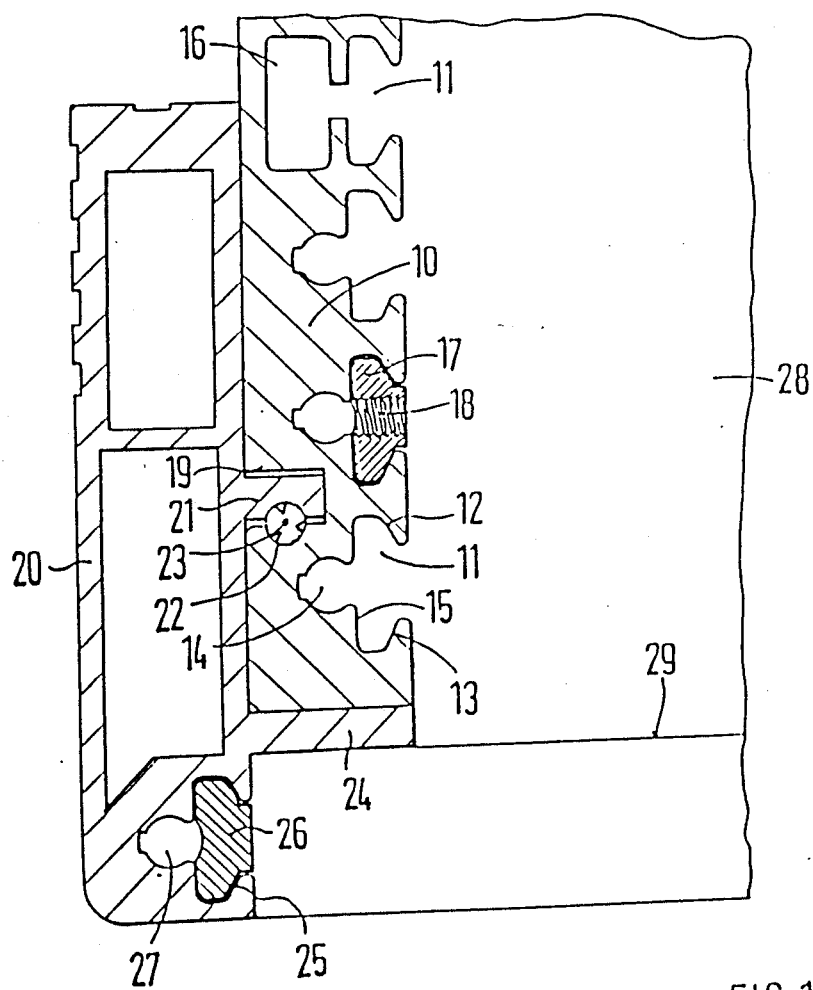
FIG. 1 shows a partial cross-sectional view of a side wall.
Figure 7:
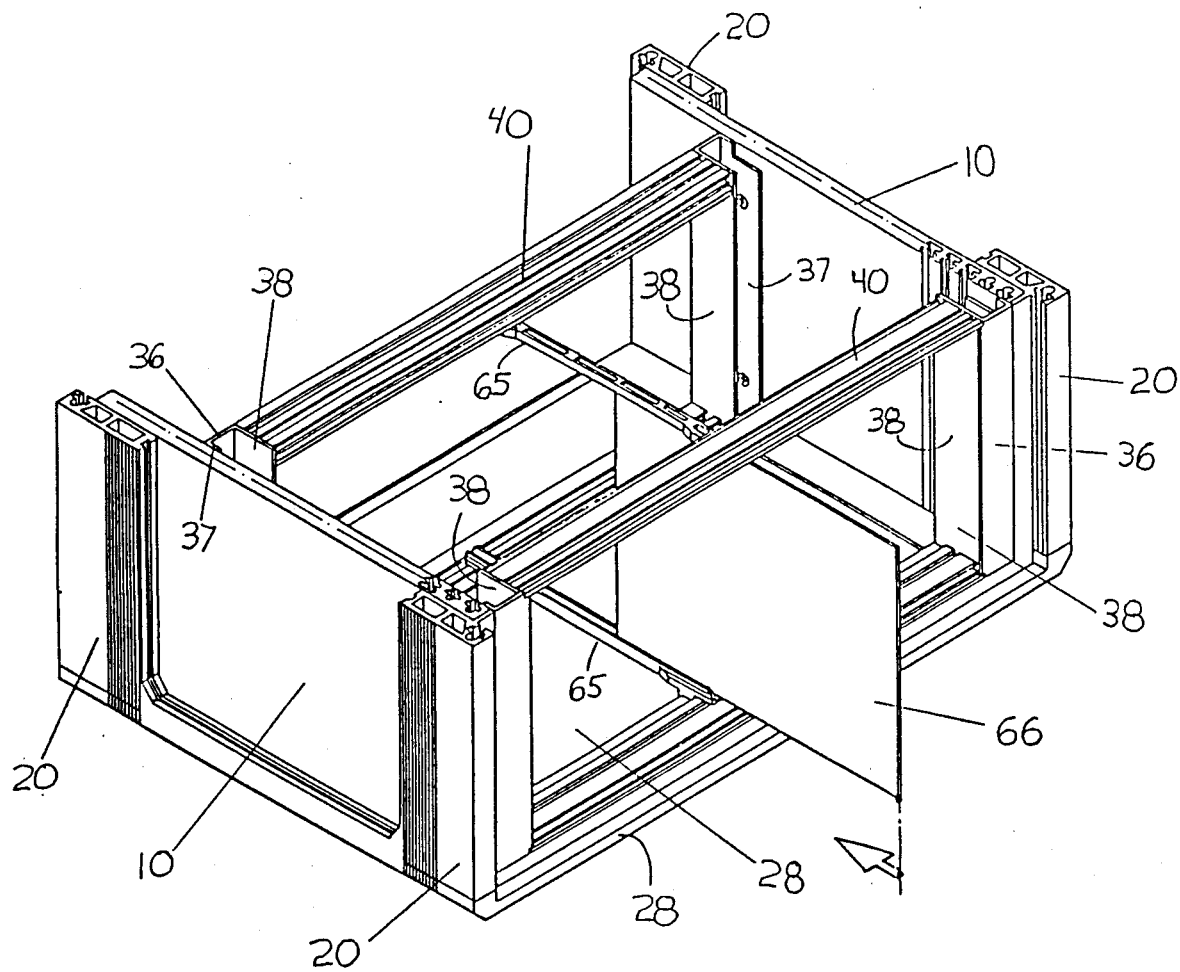
FIG. 7 shows a perspective view of an assembled multi-purpose housing according to one embodiment of this invention.

FIG. 1 shows side wall component 10 which is fastened on flat bottom plate 28. Side wall component 10 is limited in vertical height to the height of the desired interior space of the multi-purpose housing. The inner surface of side wall component 10 has T-grooves 11 which are arranged at uniform intervals from one another. The wider portion of these vertically continuous T-grooves 11 makes a transition by inclined transitional sections 12 and 13 into the insertion slots of T-grooves 11. Groove base 15 has an opening which is contiguous with screw channel 14. Screw channel 14 is generally round in cross section. Self-tapping fastening screws 60, as shown in FIG. 7, may be screwed into screw channel 14 at the horizontal edges of each side wall component 10. Bottom plate 28 and an identically designed top plate may be fastened to side wall components 10. Side wall components 10 preferably comprise metal, such as aluminum, while the top and bottom plates 28 may comprise a die-cast metal or an injection molded plastic component. T-grooves 11 may also have an opening in groove base 15 contiguous with continuous receiving channel 16 which is generally rectangular in cross section. Receiving channel 16 may be used, for example, for laying connecting cables.

Each side wall component 10 forms a side wall together with two corner units 20. Corner units 20 have the same vertical height as each side wall component 10. Corner unit 20 comprises a generally rectangular hollow structural unit with a closing web 24 projecting therefrom. In the vicinity of the two outer vertical edges of each side wall component 10, there is at least one connecting groove 19 into which a connecting web 21 projecting from corner unit 20 may be inserted.

In a preferred embodiment, semicircular recesses are on adjacent sides of connecting groove 19 and connecting web 21. Semicircular recesses are aligned perpendicular with respect to the plane of each side wall component 10, which recesses form a connecting channel 22. Connecting channel 22 is generally round in cross section, and extends continuously along the length of connecting pin 23. FIGS. 1–6 show an end view of connecting pin 23 having keyways or notches which are represented by triangles in the end view. In this manner, corner units 20 are easily connectible to side wall component 10. Closing web 24 abuts the vertical edge of side wall component 10 and completes the interval, that is the spacing to the adjacent T-groove 11 of side wall component 10. Corner units 20 extend beyond the vertical edges of side wall component 10. Corner units 20 have a T-groove 25 near the outer edge extending parallel to T-grooves 11 in side wall component 10, which groove is offset with respect to T-grooves 11 of segment 10 by the thickness of side wall component 10. According to a preferred embodiment, corner units 20 provide mounts for the insertion of a back wall, a door or an inspection window at the sides of the multi-purpose housing. The multi-purpose housing may comprise two side walls, a top plate and a bottom plate 28. Top and bottom plates 28 preferably have ledges 29 which facilitate the assembly of the multi-purpose housing.

If offset T-grooves are not necessary for mounting additional components, then closing strips 26 may be inserted into T-grooves 25. Offset T-grooves 25 may also be provided with continuous screw channels 27 and are preferably identical in cross-sectional configuration to T-grooves 11 in side wall components 10. Connecting strips 17 are insertable into T-grooves 11 and have a plurality of tapped holes 18 at prescribed intervals. Closing strips 26 and connecting strips 17 may be provided in lengths corresponding to the height of the side wall components 10. Also, shorter connecting strips 17 may be inserted at random points along T-grooves 11. Tapped holes 18 preferably have a diameter which is larger than the width of the opening in groove base 15. A screw which is fastened in tapped hole 18 may thus be supported by groove base 15 to brace connecting strip 17 in T-groove 11. Since side wall components 10 are designed to be identical at the two vertical edge regions, identical mounts result at the two edges and the interior may have connecting strips 17 along its entire depth. A multi-purpose housing may thus be provided which is accessible on both sides and which may be enclosed by means of two doors or inspection windows. The vertical height of the multi-purpose housing is easily adaptable, since only side wall components 10 and corner units 20 need to be adjusted to the required vertical heights. One side wall component 10 and two corner units 20 may also be provided as a one-piece side wall whereby the necessary parts may be reduced. The use of overall side walls comprising separate components is preferred, particularly since side wall components 10 can be made available in various widths for assembly of multi-purpose housings of various depths.

Figure 2:
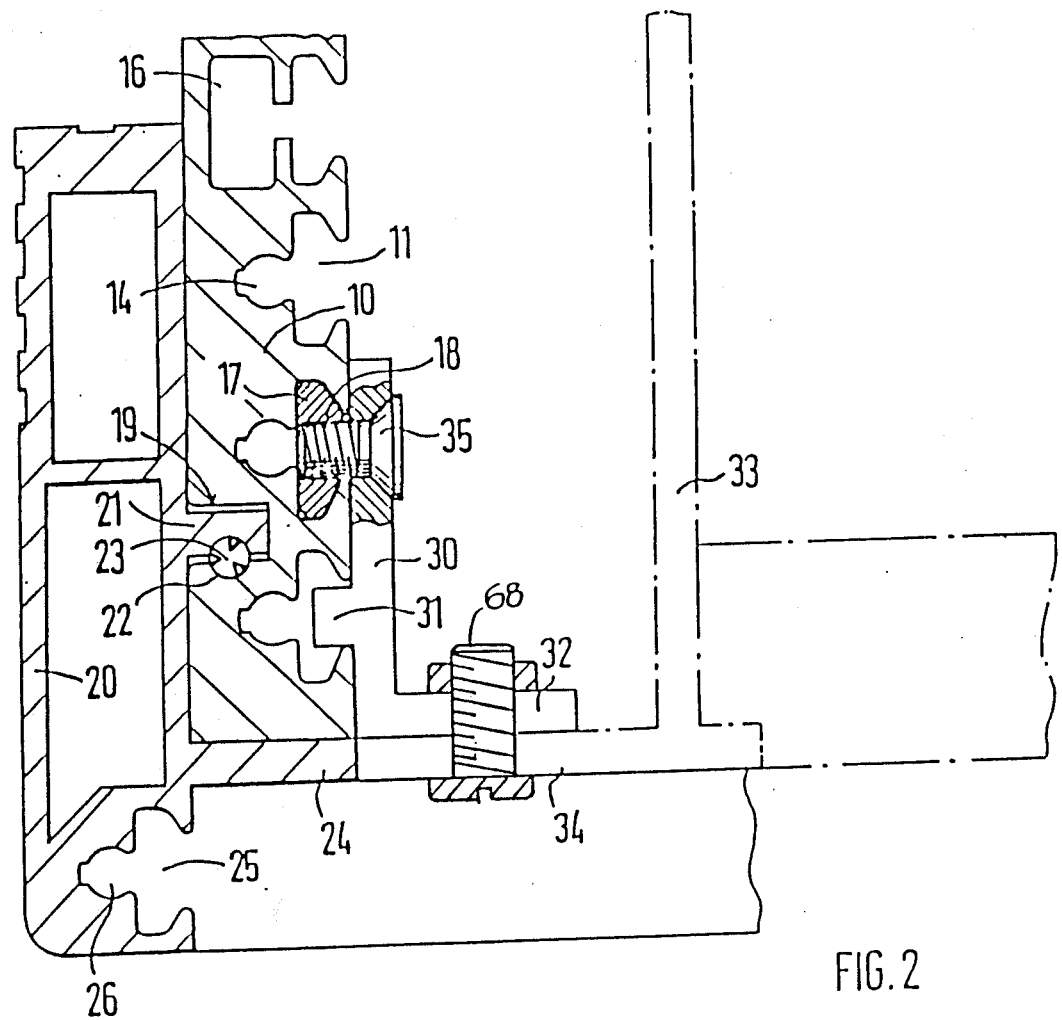
FIG. 2 shows a partial cross-sectional view of the mounting of a component holder.

FIG. 2 shows how component holder 33, which has mounting flanges 34, may be installed with two mounting angles 30. One leg of each mounting angle 30 is attached to the adjacent side wall component 10 with screw 35 fastened in connecting strip 17 which is inserted in T-groove 11. The other legs 32 of mounting angles 30 are oriented opposite one another. Mounting flanges 34 of component holder 33 are detachably connected, for example, by screw fasteners 68 as shown in FIG. 2, to legs 32 of mounting angles 30. Mounting angles 30 are preferably dimensioned so that mounting flanges 34 of the component holder 33 abut flush with closing webs 24 of corner units 20 of side wall components 10 so that mounting a door or an inspection window is not impaired. Fastening mounting angle 30 to side wall component 10 may be accomplished with a single screw 35, when projection 31 on mounting angle 30 is inserted into a free T-groove 11 and retains mounting angle 30 so that it cannot pivot.

Figure 3:
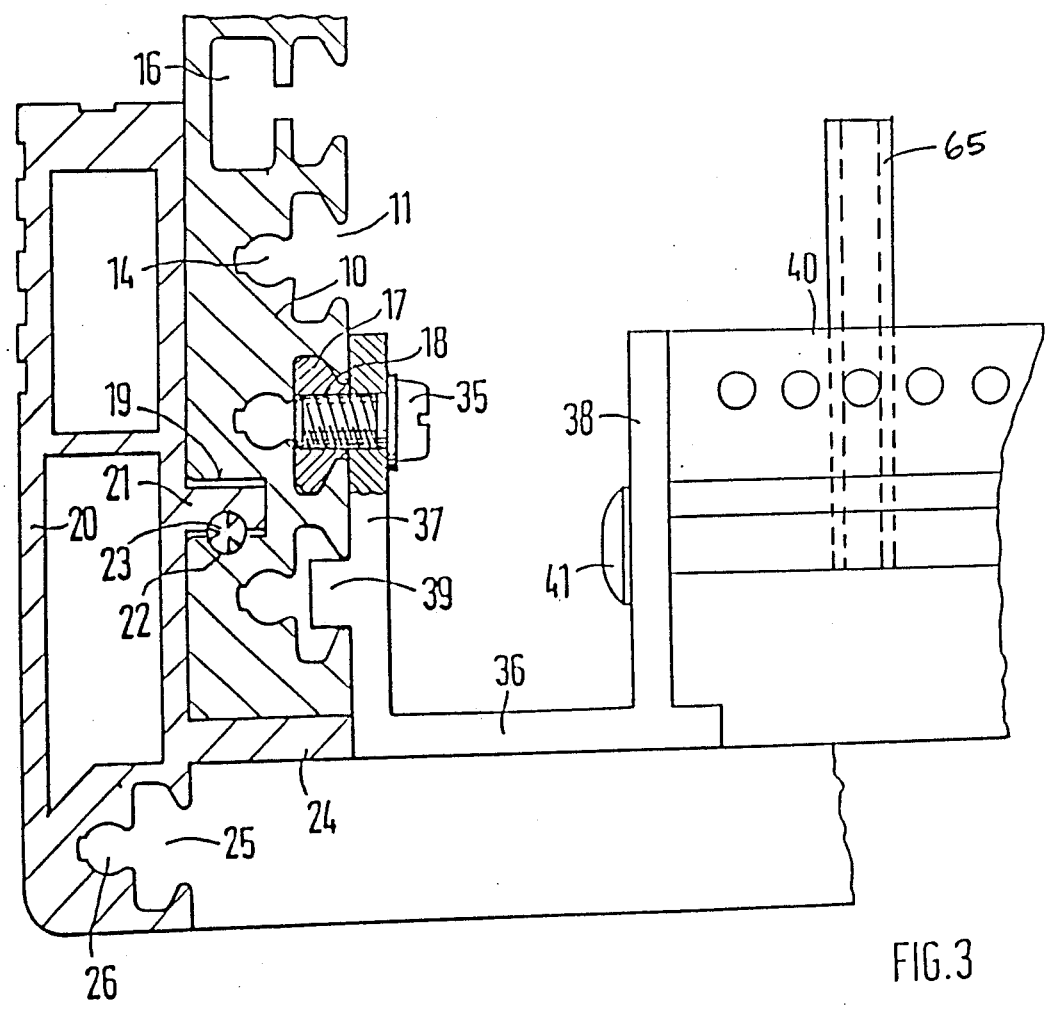
FIG. 3 shows a partial cross-sectional view of the mounting of guide plate and cross-supports.

As shown in FIG. 3, one or more guide strips 65 can be supported by cross supports 40 which are connectible to side wall component 10 of the multi-purpose housing by two U-shaped mating components 36. Screw 35 attaches leg 37 of each mounting component 36 to side wall component 10. Projection 39, when inserted in another T-groove 11, provides non-pivotable attachment of mounting component 36, and screw 41 attaches leg 38 of mounting component 36 to cross supports 40. According to this embodiment, mounting component 36 abuts flush with closing web 24 of corner unit 20.

Figure 4:
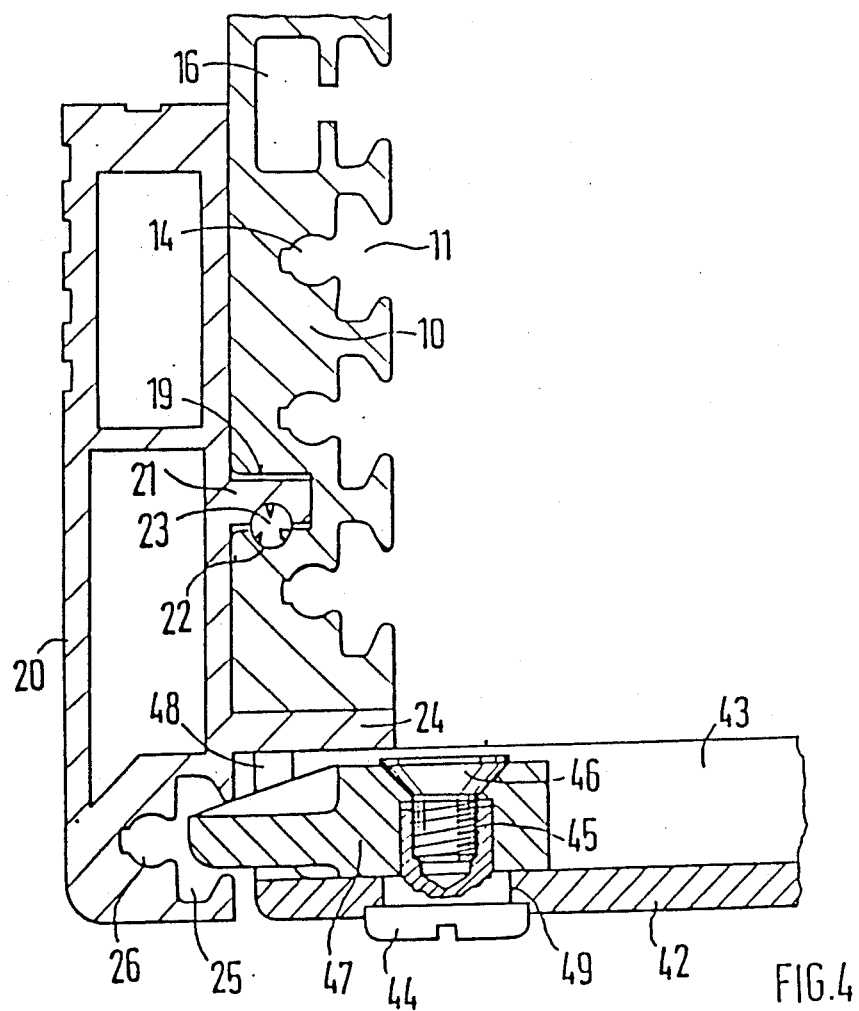
FIG. 4 shows a partial cross-sectional view of the attachment of a back wall.

As shown in FIG. 4, back wall 42 may be provided with surrounding edge 43 and is attachable to the multi-purpose housing with casement fasteners 47. Bearing screws 44 are rotatably seated in bores 49 of back wall 42. Casement fastener 47 is attachable to bearing screw 44 with screw 46, which is fastened in a corresponding tapped bore 45. The vertical edge of back wall 42 has perforations 48, through which casement fasteners 47 project, and may be pivoted into offset T-grooves 25 of corner units 20 of side wall component 10. Back wall 42 may thus be fastened to the multi-purpose housing so that it is easily detachable. For example, with four casement fasteners 47, back wall 42 is flush with corner units 20 of side wall component 10 at the vertical edges of the multi-purpose housing. Bearing screws 44 preferably have slots so that they are rotatable from outside of casement fastener 47.

Figure 5:
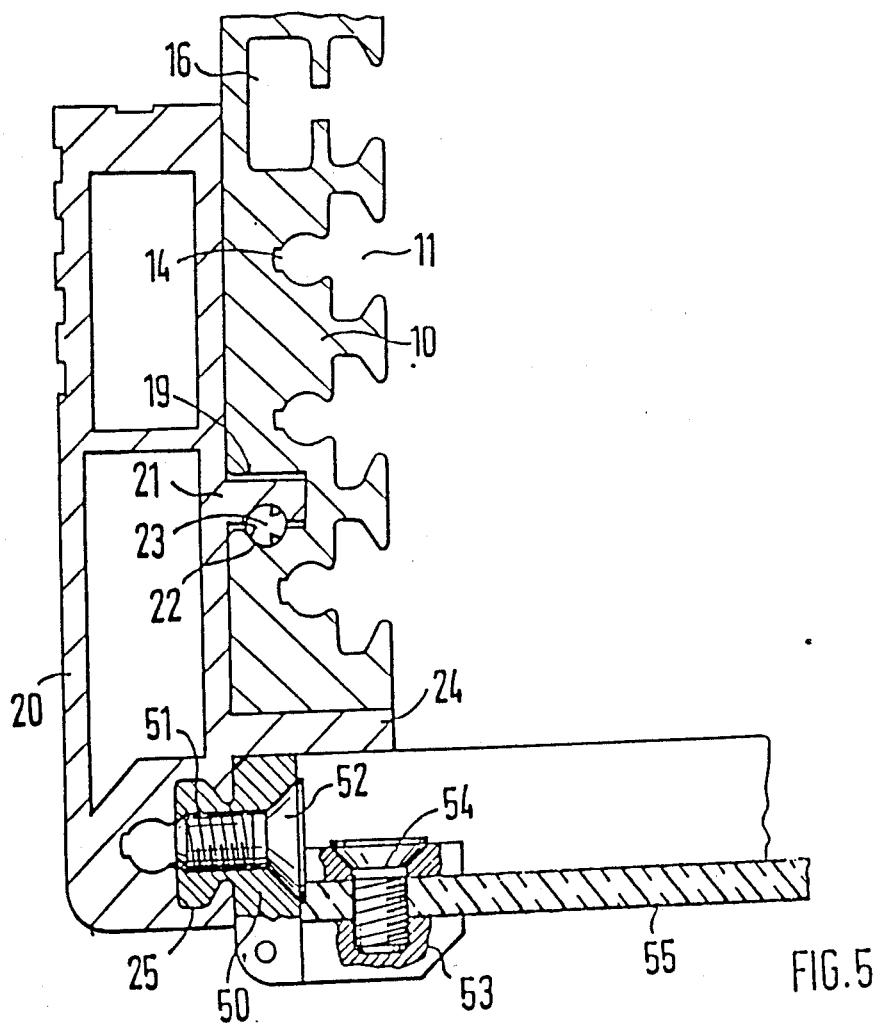
FIG. 5 shows a partial cross-sectional view of a hinged inspection window.

FIG. 5 illustrates the attachment and mounting of inspection window 55. Movable hinge components 53 are secured to inspection window 55 with screws 54. Stationary hinge components 50 are mounted in offset T-grooves 25 of corner units 20 of side wall component 10. Stationary hinge components have a connecting strip so that screw 52 is attached in the tapped bore 51 and hinge component 50 is thereby braced in offset T-groove 25. Inspection window 55 encloses the open side of the multi-purpose housing and is flush with the vertical edges of side wall components 10. On the opposite side of inspection window 55, a hinged connection is provided in the same manner between inspection window 55 and the adjacent corner unit 20 of side wall component 10. Only in the vicinity of the hinge components do partial areas extend slightly beyond the plane of the multi-purpose housing. The outer surface of closing web 24 is positioned at a corresponding interval from the middle of the adjacent T-groove 11 of side wall component 10 so that offset T-groove 25 may be provided at a spacing which accommodates the thickness of back wall 42 as shown in FIG. 4 or inspection window 55 as shown in FIG. 5.

Figure 6:
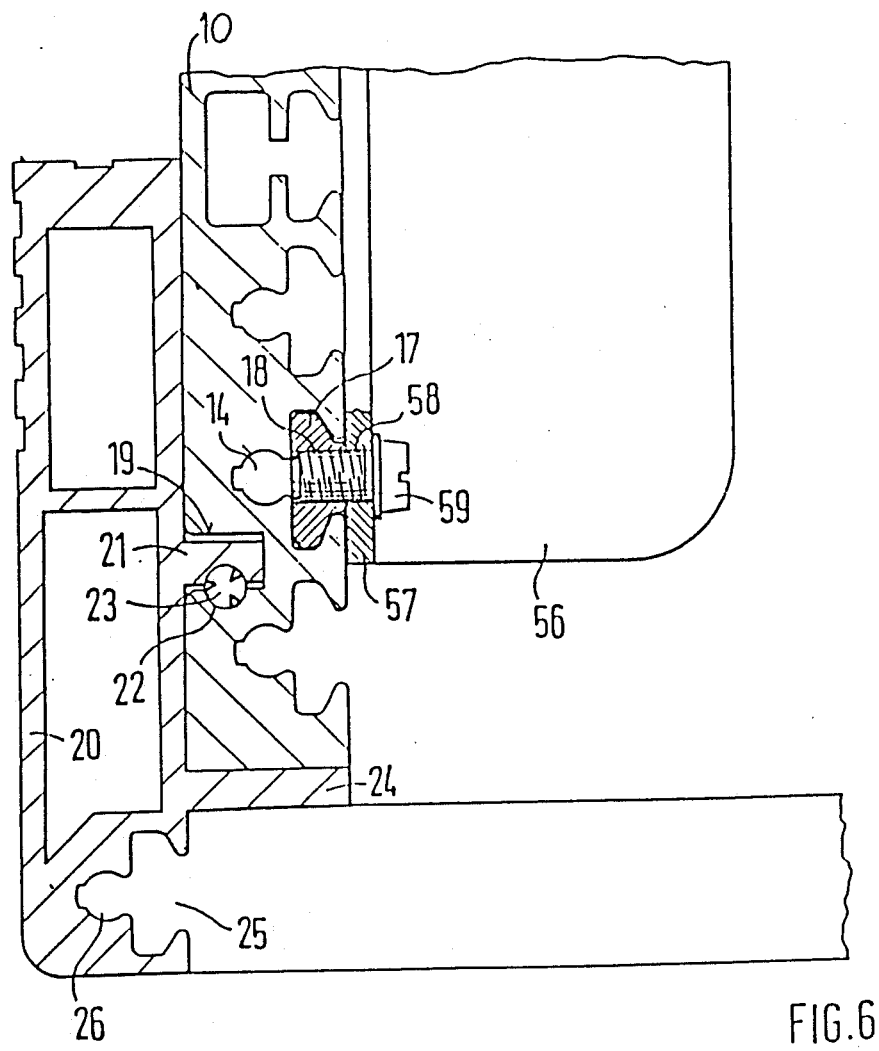
FIG. 6 shows a partial cross-sectional view of the mounting of slide rails for insertable units.

As shown in FIG. 6, slide rails, which include flange support 56 and vertical leg 57, have L-shaped cross sections and are attachable to side wall component 10 at vertical leg 57. Flange support 56 and vertical leg 57 are connected to form an L-shaped bracket. As shown in FIG. 6, the L shaped bracket is secured with respect to side wall component 10 with at least one screw 59. Screw 59 is fastened through bore 58 into tapped hole 18 of connecting strip 17. If connecting strip 17 does not extend for the entire vertical height of side wall component 10, it is movable and may be braced and fixed in T-groove 11 with a screw fastened in an empty tapped hole 18. Each slide rail for flange support 56 is thus fastened in at least two points in its horizontal position on side wall component 10. Flange supports 56 are supported on the horizontal legs of the slide rails. Flange supports 56 are supported on horizontal legs of the side rails. Flange support 56 can also be fastened to side wall components 10 of the multi-purpose housing with telescoping extensions.

FIG. 7 shows an embodiment in perspective view of an assembled multi-purpose housing. Cross supports 40 each have a recess for attaching end sections of guide strips 65. The recesses of cross supports 40 may extend across an entire length of cross supports 40.

Referring to FIG. 3, in another preferred embodiment, cross supports 40 have a plurality of holes. The studs or pins of guide strip 65 may be inserted into the holes of cross support 40 to connect guide strip 65 to cross support 40. Cross support 40 can accommodate a plurality of guide strips 65. As shown in FIGS. 3 and 7, the recesses or holes of cross supports 40 are opposite the front and rear sides of the multi-purpose housing.

Referring to FIG. 7, such cross support 40 is secured to leg 38 mounting component 36. In a preferred embodiment, four cross supports 40 and four mounting components 36 are positioned between side wall components 10 and two guide strips 65. Each guide strip 65 defines a U-shaped recess. As shown in FIG. 7, plug-in-plate 66 is slideably connected to guide strip 65. An example of plug-in-plate 66 is a printed circuit board. Although not shown in FIG. 7, a top plate 28 may be attached to the multi-purpose housing.

Figure 8:
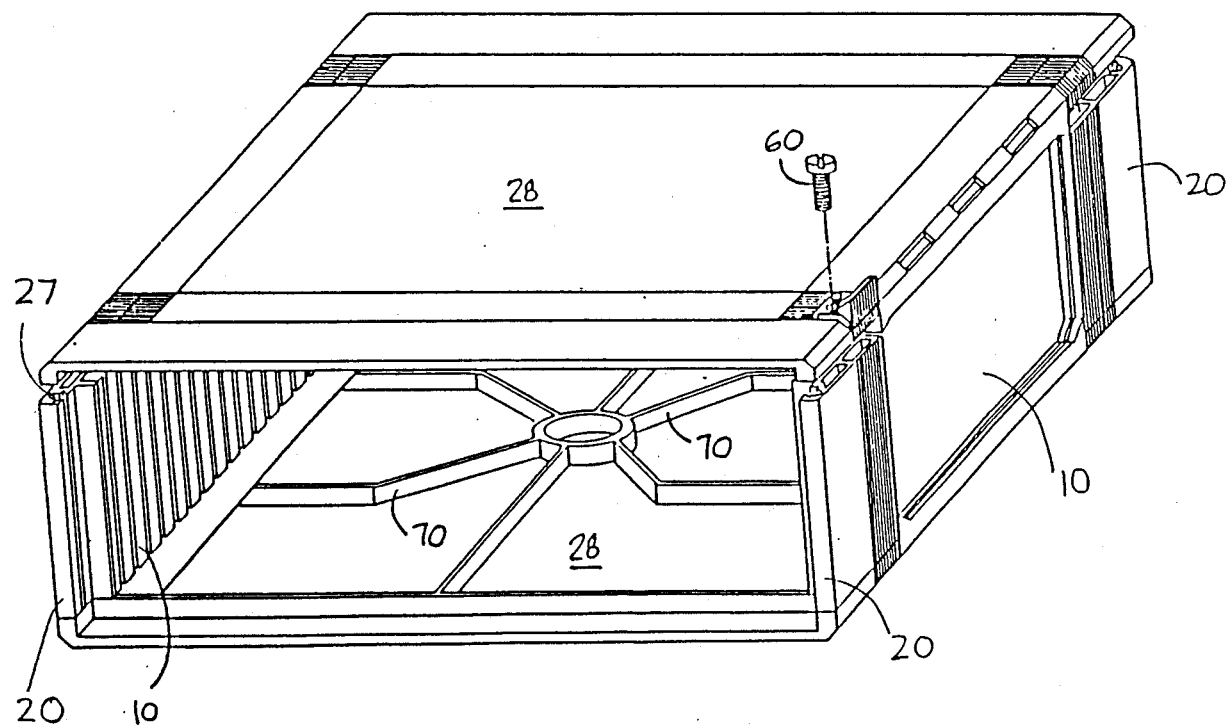
FIG. 8 shows a perspective view of an assembled multi-purpose housing according to one embodiment of this invention.

FIG. 8 shows one embodiment in a perspective view of an assembled multi-purpose housing. FIG. 8 illustrates the relationship between top and bottom plates 28, side wall components 10. As shown in FIG. 7, top wall 28 is pivotally connected with a pivotal flange to cover screw 60. As shown in FIG. 8, there are four corner units 20. In one embodiment, top and bottom plates 28 have a stiffening or strengthening structure. As shown in FIG. 8, the stiffening or strengthening structure 70 may be ribs extending from edges of bottom plate 28 to a centrally located stiffening ring. Although not shown in FIG. 8, top plate 28 may also have the same stiffening or strengthening structure 70.

We claim:

1. Multi-purpose housing for electrotechnical equipment comprising two identical side walls attached to a top wall and a bottom wall, and attachment means for installation of a component holder, cross supports, slide rails has flange supports and for attachment of a back wall, a door or an inspection window, wherein each said side wall comprises a side wall component with a corner unit mounted at each terminal vertical side wall of said side wall component; said side wall components have inner surfaces provided with vertically continuous T-grooves spaced at equal intervals from one another; said T-grooves have an inner groove base, and along at least a portion of the vertical height of said T-grooves, said inner groove base has an opening and makes a transition into a continuous screw channel which is generally round in cross section; said corner units are provided with at least one vertically continuous T-groove corresponding to and offset from said T-grooves in said side wall components; and connecting strips with tapped holes and closing strips are insertable into said side wall component T-grooves and said corner unit T-grooves.

2. Multi-purpose housing according to claim 1 wherein said corner units are fastened at each terminal vertical side wall of said side wall component, said corner units extend beyond said terminal vertical side walls of said side wall components, said T-grooves in said corner units are provided in the portions of said corner units which project beyond said side wall components, and said corner unit T-grooves extend substantially parallel to said side wall component T-grooves.

3. Multi-purpose housing according to claim 2, wherein said corner units have a hollow, generally rectangular configuration.

4. Multi-purpose housing according to claim 1, wherein at least one connecting groove is provided in an outer surface of said side wall components near each said terminal vertical side wall; said corner units are provided with connecting webs on their inner surfaces abutting said side wall components, said connecting webs are inserted in said connecting grooves of said side wall components; and a vertically continuous connecting channel which is generally round in cross-sectional configuration is provided at the interface of said connecting web with said connecting groove for receiving a connecting pin.

5. Multi-purpose housing according to claim 4, wherein each said corner unit has a closing web projecting substantially perpendicularly therefrom and said closing web abuts said terminal vertical side wall of said side wall components.

6. Multi-purpose housing according to claim 1, wherein said T-grooves provided in said side wall components and said corner units have the same cross-sectional configuration.

7. Multi-purpose housing according to claim 1, wherein said top wall and said bottom wall are identical and are provided with a ledge which serves as a stop in the area of said terminal vertical side walls of said side wall components.

8. Multi-purpose housing according to claim 1, wherein said tapped holes in said connecting strips have a diameter larger than the width of said opening in said inner groove base of said T-grooves.

9. Multi-purpose housing according to claim 1 wherein the length of said connecting strips and said closing strips corresponds to the vertical height of said side wall components and said corner units.

10. Multi-purpose housing according to claim 1, wherein a respective said side wall component and two said corner units are combined to form a one-piece side wall.

11. Multi-purpose housing according to claim 1, wherein said attachment means comprise mounting angles for mounting a component holder provided with lateral mounting flanges, said mounting angles have a first leg and a second leg oriented substantially perpendicularly to one another, and said first leg is fastened to a connecting strip mounted in one of said T-grooves of a respective said side wall component, said second leg is detachably connectible to a mounting flange on said component holder.

12. Multi-purpose housing according to claim 1, wherein said attachment means comprise generally U-shaped mounting components for mounting cross supports, said U-shaped mounting components have a first attachment leg and a second attachment leg oriented substantially parallel to one another, said first attachment leg is fastened to a connecting strip mounted in one of said T-grooves of a respective said side wall component, and said second attachment leg is detachably connectible to said cross supports.

13. Multi-purpose housing according to claim 12, wherein each of said U-shaped mounting components is provided with a projection extending substantially perpendicularly therefrom and a respective said projection is inserted in a respective T-groove of said side wall components to provide non-pivotable attachment of said U-shaped mounting components to said side wall components.

14. Multi-purpose housing according to claim 1, wherein a box-like back wall is attached to said side wall components by means of casement fasteners which are mounted on said back wall and project through a perforation in a vertical edge of said back wall, and said casement fasteners are retained in said T-grooves of said corner units.

15. Multi-purpose housing according to claim 1, wherein at least one of a door and an inspection window is attached to said side wall components in the vicinity of said terminal vertical side walls, at least one of said door and said inspection window having a movable hinge component mounted thereon and connected to a stationary hinge component fastened to a connecting strip in a respective said T-groove of a respective said corner unit.

16. Multi-purpose housing according to claim 15, wherein said connecting strip in said respective T-groove of said respective corner unit is provided as a one-piece component with said stationary hinged component.

17. Multi-purpose housing according to claim 1, wherein slide rails for insertable units are fastened to said side wall components, said slide rails have a generally L-shaped configuration with a vertically oriented leg, and said vertically oriented leg is fastened to connecting strips retained in at least two T-grooves of said side wall components.

18. Multi-purpose housing according to claim 11, wherein said first leg of said mounting angles is provided with a projection extending substantially perpendicularly therefrom and.- said projection is inserted in a T-groove of a respective said side wall component to provide non-pivotable attachment of said mounting angles to said side wall components.

19. Multi-purpose housing for electrotechnical equipment comprising two identical side walls attached to a top wall and a bottom wall, and attachment means for installation of a component holder, cross supports, slide rails has flange supports and for attachment of a back wall, a door or an inspection window, characterized in that each said side wall comprises a side wall component with a corner unit mounted at each terminal vertical side wall of said side wall component; said side wall components have inner surfaces provided with vertically continuous T-grooves spaced at equal intervals from one another; said T-grooves have an inner groove base, and along at least a portion of the vertical height of said T-grooves, said inner groove base has an opening and makes a transition into a continuous channel which is generally rectangular in cross section; said corner units are provided with at least one vertically continuous T-groove corresponding to and offset from said T-grooves in said side wall components; and connecting strips with tapped holes and closing strips are insertable into said side wall component T-grooves and said corner unit T-grooves.

20. Multi-purpose housing according to claim 19 wherein said corner units are fastened at each terminal vertical side wall of said side wall component, said corner units extend beyond said terminal vertical side walls of said side wall components, said T-grooves in said corner units are provided in the portions of said corner units which project beyond said side wall components, and said corner unit T-grooves extend substantially parallel to said side wall component T-grooves.

* * * * *